(12) United States Patent
Gomez et al.

(10) Patent No.: US 6,508,924 B1
(45) Date of Patent: Jan. 21, 2003

(54) CONTROL OF BREAKDOWN PRODUCTS IN ELECTROPLATING BATHS

(75) Inventors: Luis A. Gomez, Patchoque, NY (US); Rozalia Beica, Bayport, NY (US); Denis Morrissey, Huntington, NY (US); Eugene N. Step, Newton, MA (US)

(73) Assignee: Shipley Company L.L.C., Marlborough, MA (US)

( * ) Notice: Subject to any disclaimer, the term of this patent is extended or adjusted under 35 U.S.C. 154(b) by 140 days.

(21) Appl. No.: 09/584,124

(22) Filed: May 31, 2000

(51) Int. Cl.[7] ............................................. C25D 21/18
(52) U.S. Cl. ............................ 205/81; 205/82; 205/99; 205/123; 205/786.5; 205/787
(58) Field of Search ............................... 205/81, 82, 99, 205/123, 157, 786.5, 787

(56) References Cited

U.S. PATENT DOCUMENTS

| | | | | |
|---|---|---|---|---|
| 3,994,785 A | * | 11/1976 | Rippere | 204/10 |
| 4,089,754 A | * | 5/1978 | Tremmel et al. | 204/43 T |
| 4,132,605 A | | 1/1979 | Tench et al. | |
| 4,917,774 A | | 4/1990 | Fisher | 204/153.1 |
| 5,223,118 A | | 6/1993 | Sonnenberg et al. | 205/81 |
| 5,252,196 A | | 10/1993 | Sonnenberg et al. | 205/296 |
| 5,935,402 A | * | 8/1999 | Fanti | 205/101 |
| 6,113,771 A | * | 9/2000 | Landau et al. | 205/123 |
| 6,224,737 B1 | * | 5/2001 | Tsai et al. | 205/123 |

FOREIGN PATENT DOCUMENTS

DE  199 11 447 A1  3/1999

* cited by examiner

Primary Examiner—Nam Nguyen
Assistant Examiner—William T. Leader
(74) Attorney, Agent, or Firm—S. Mathew Cairns

(57) ABSTRACT

Disclosed are methods for analyzing additive breakdown products in electroplating baths as well as methods of controlling the presence of such breakdown products in electroplating baths.

11 Claims, 5 Drawing Sheets

CONTROL OF BREAKDOWN PRODUCTS IN ELECTROPLATING BATHS

BACKGROUND OF THE INVENTION

The present invention relates generally to the field of electroplating baths. In particular, the present invention relates to the analysis and control of products in copper electroplating baths.

Electroplating is a complex process involving multiple ingredient, in a plating bath. It is important that the concentration of several of the ingredients be kept with in close tolerances in order to obtain a high quality deposit. In some cases, chemical analysis of individual solution constituents can be made regularly (such as pH measurement for acid con tent), and additions made as required. However, other addition agents such as brighteners, leveling agents, suppressants, etc., together with impurities, cannot be individually analyzed on an economical or timely basis by a commercial plating shop. Their operating concentration is low and their quantitative analysis is complicated and subject to error.

A known method for controlling such ingredients in an electroplating bath is to make regular additions of particular ingredients based upon empirical rules established by experience. However, depletion of particular ingredients is not always constant with time or with bath use. Consequently, the concentration of the ingredients is not actually known ;and the level in the bath eventually diminishes or increases to a level where it is out of the acceptable range tolerance. If the additive content goes too far out of range, the quality of the metal deposit suffers and the deposit may be dull in appearance and/or brittle or powdery in structure. Other possible consequences include low throwing power and/or plating folds with bad leveling.

Another known method for plating bath control is to plate articles or samples and visually evaluate the plating quality to determine if the bath is performing satisfactorily. In standard Hull Cell and "Bone Pattern" tests, a specially shaped test specimen is plated a d then evaluated to determine the quality of the deposit along with shape. This is a time consuming test which gives at best a rough approximation of the concentration of the constituents of the bath.

The electroplating of through-hole interconnections in the manufacture of multilayer printed circuit boards is an example of the use of an electroplating metal where high quality plating is required. It is known that the concentration of the organic additives, such as brighteners and levelers, within the plating solution must be maintained in low concentration (typically less than 100 parts per million parts of solution—ppm) in order to obtain acceptable deposits on printed circuit boards. This must be done to maintain proper mechanical properties for resistance to thermal stresses encountered during manufacture and use and to assure the proper thickness of the deposit in the through-holes and leveling. The concentration of the organic additive agents fluctuates because of oxidation at the anode. Reduction at the cathode, and chemical degradation. When the additive level is insufficient, deposits are burned and powdery in appearance whereas excessive addition agents induce brittleness and non-uniform deposition. Hull cell tests, Bone Pattern tests, and Pencil tests, combined with periodic additions of fresh additives, were the methods used to maintain a control concentration of the additive until recently. These methods were unreliable and circuit board quality suffered as a consequence of these unreliable methods.

Conventional electroplating bath analytical tools measure the total electrochemical activity of the plating bath. Such total activity includes the total organic additives present including any additive breakdown products. For example, U.S. Pat. No. 4,917,774 (Fisher) discloses a method in which a small amount of metal is electrodeposited onto an inert electrode such as platinum or gold under controlled conditions of electrode potential and mass transport in the solution. The amount of metal deposited is determined by integrating the current passed during redissolution or "stripping" of the deposited metal from the surface as the electrode potential proceeds through a cycle including plating and stripping. The quantity of metal deposited, and subsequently redissolved, is related to the concentration of additives affecting the rate of deposition. Such methods are used to analyze only the particular additives present in the plating baths.

U.S. Pat. No. 5,223,118 (Sonnenberg et al.) discloses a method for determining the quantity of brighteners and levelers present in an electroplating bath for the plating of printed wiring board substrates. In this method, the determination of both brightener and leveler is accomplished in one step.

In the electroplating of electronic devices having small features, such as wafers used in the manufacture of integrated circuits or semiconductors, the control of additive concentration in the plating bath is very important. The concentrations of certain additive in electroplating baths, particularly copper plating baths, must be maintained within certain limits in order to obtain superfilling, or bottom-up fill, during plating of wafers. Many of the known compounds that provide superfill undergo redox reactions at both the electrode surfaces and in solution. Known reactions that occur in the electroplating bath include reduction of the additive at the cathode, i.e. wafer, during plating, oxidation of the additive at the copper anode during, plating, reduction of the additive at the copper anode during idling, and formation of highly electroactive copper complexes from reduction byproducts. Such reactions can have deleterious effects on the ability of the plating bath to perform at acceptable levels. Thus there is a need for a method of determining the quantity additive breakdown products in such electroplating baths.

Heretofore, no methods have been proposed that will accurately determine the amount of additive breakdown products in an electroplating bath, particularly in the presence of unreacted additive compound. There is thus a need for analytical methods for determining and controlling the amount of additive and additive breakdown product present in copper electroplating baths, particularly in wafer electroplating.

SUMMARY OF THE INVENTION

It has been surprisingly found that the methods of the present invention provide a means for analyzing the concentrations of certain additive breakdown products as well as a means for controlling the concentrations of such components in the plating bath. The present invention allows for the measurement of additive breakdown product in the parts per billion range in presence of the additive and directly in the bath.

The present invention provides a method for determining the quantity of additive breakdown products in an electroplating bath including the steps of: a) obtaining a plurality of plating baths where each bath has a known quantity of the additive breakdown products, but where the quantity of additive breakdown product in each bath differs from the quantity in the other baths: b) for each bath, providing a counter electrode, a cleaned working electrode and a reference electrode immersed in the bath, and equilibrating the working electrode without energy input to adsorb additive breakdown product for a period of time until the change in potential of the working electrode with time is minimal and measuring the value of the potential; c) for each bath, correlating the quantity of additive breakdown product with the value of potential obtained in step b); d) obtaining a plating bath having an unknown quantity of additive breakdown product, placing the electrodes in the bath and performing step b); and e) choosing from the correlations in step c a quantity of additive breakdown product which corresponds to the equilibrated working electrode potential for the bath with the unknown quantity of additive breakdown product.

The present invention also provides a method for controlling the presence of additive breakdown products in an electroplating bath including the steps of: a) determining the quantity of additive breakdown product as described above; and b) comparing the quantity of additive breakdown product to a preset value; provided that when the quantity of additive breakdown product exceeds the preset value, a control process is activated that reduce the quantity of additive breakdown product.

The present invention further provides a method of maintaining within wafer uniformity during the electroplating of wafers including the step of controlling the level of additive breakdown product in the electroplating bath.

DETAILED DESCRIPTION OF THE INVENTION

As used throughout the specification, the following abbreviation shall have the following meanings, unless the context clearly indicates otherwise: m $cm^2$=milliamperes per square centimeter; mV/s=millivolts per second; rpm= revolutions perminute; Å=angstroms; ASF=amperes per square foot; $\mu$C=microCoulombs; and ppb=part per billion.

As used throughout the specification, "feature" refers to the gemetries on a substrate, such as, but not limited to, trenches and vias. The term "small features" refers to features that are one micron or smaller in size. "Very small features" refers to features that are one-half micron or smaller in size. As used throughout this specification, the term "plating" refers to metal electroplating, unless the context clearly indicates otherwise. "Deposition" and "plating" are used interchangeably throughout this specification.

Many organic additives are used in metal electroplating baths, such as, but not limited to, leveling agents, brighteners, accelerators, suppressors, surfactants, wetting agents and the like. Certain organic additives are known to breakdown during the electroplating process to form breakdown products. Cyclic voltammetry stripping ("CVS") is a known method for analyzing additives in electroplating baths. CVS analyzes total additive concentration in the plating baths, including any breakdown products. Thus, the CVS measurement is strongly affected by a buildup of breakdown products in the bath. Such CVS method does not adequately account for the presence of breakdown products, especially breakdown products that are strongly adsorbed.

Figure 1:
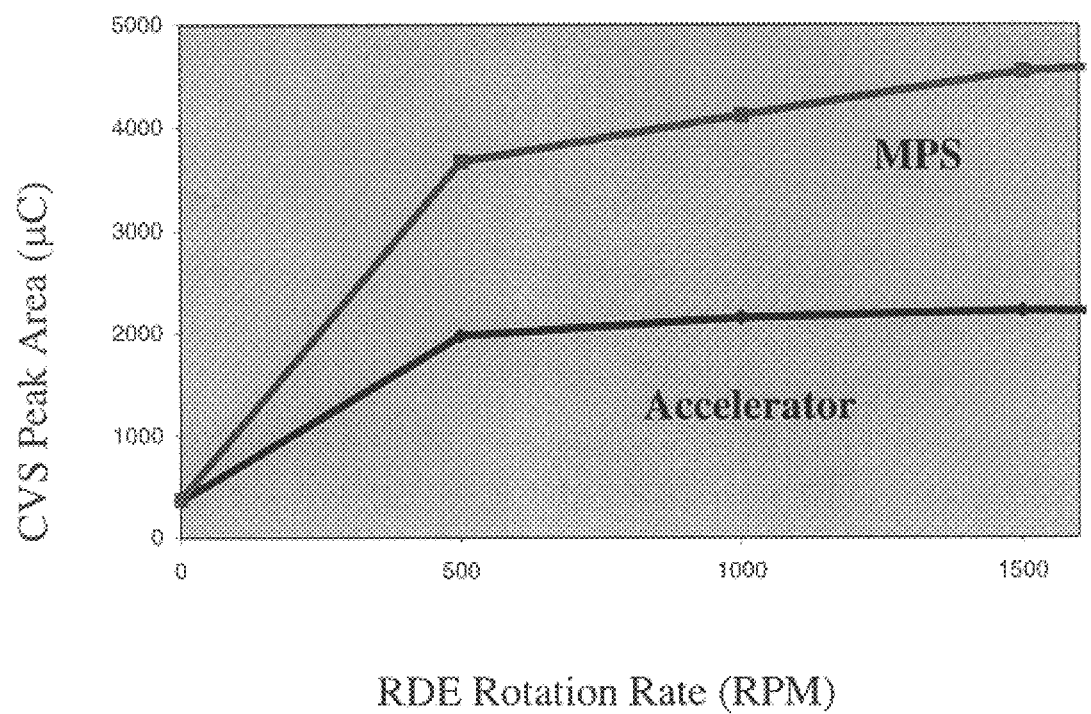
FIG. 1 shows a plot flow dependence of electroplating rate.

FIG. 1 shows a plot flow dependence of electroplating rate for a bath containing an organic disulfide accelerator and for a bath containing a thiol breakdown product ("MPS") of the accelerator versus the rotation speed of a rotating disc electrode ("RDE") CVS shows that the addition of the breakdown product, MPS, to the plating bath resulted in increased plating rates, as measured by CVS peak area, for a given potential. This strong dependence of CVS peak area on rotation rate is due to increased plating rates due to the stronger adsorption of MPS to the copper surface.

Open circuit potential ("OCP") measures the chemical potential at he electrode surface. Certain additive breakdown products, particularly MPS, cause a strong shift in the potential, indicating a significant redistribution of surface concentrations of adsorbed species until equilibrium is reached. The initial slope of the OCP can be used to monitor the rate of adsorption of additive breakdown products to the metal surface, such as a copper surface.

Figure 2:
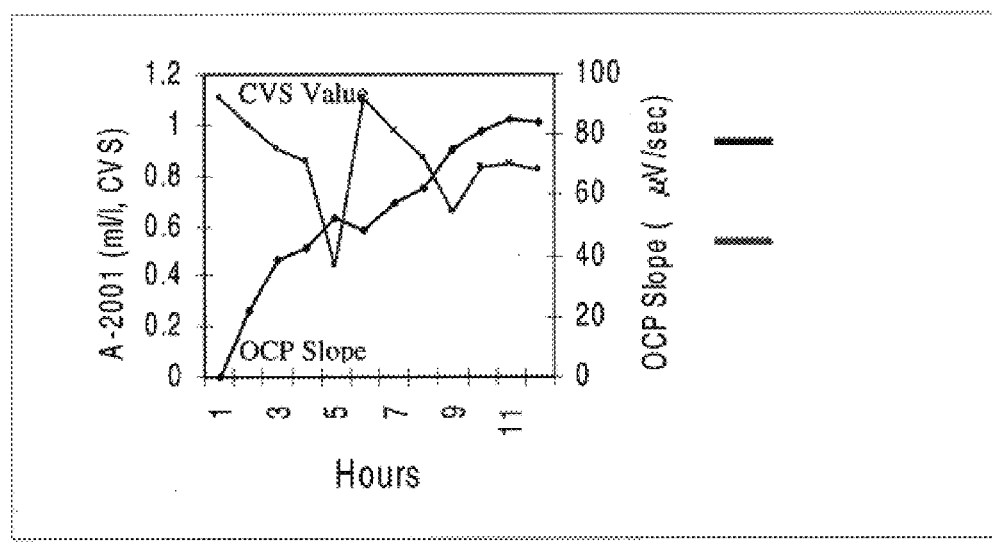
FIG. 2 shows a plot of the concentration of additive in a plating bath with time as determined by CVS and a plot of the open circuit potential slope with time

A plot of the concentration of additive in a plating bath with time a determined by CVS and a plot of the open circuit potential slope with time are shown in FIG. 2. This plating bath was held at open circuit with replenishment of accelerator additive to nominal values. The CVS plot shows the expected trends, however, the OCP plot indicates a gradual buildup of decomposition products which are not detected by CVS. Thus, OCP is a better measure of additive breakdown product than CVS.

The present invention provides a method for determining the quantity of additive breakdown products in an electroplating bath including the steps of: a) obtaining a plurality of plating baths where each bath has a known quantity of the additive breakdown products, but where the quantity of additive breakdown product in each bath differs from the quantity in the other baths; b) for each bath, providing a counter electrode, a cleaned working electrode and a reference electrode immersed in the bath, and equilibrating the working electrode without energy input to adsorb additive breakdown product for a period of time until the change in potential of the working electrode with time is minimal and measuring the value of th potential; c) for each bath, correlating the quantity of additive breakdown product with the value of potential obtained in step b); d) obtaining a plating bath having an unknown quantity of additive breakdown product, placing the electrodes in the bath and performing step b); and e) choosing from the correlations in step c a quantity of additive breakdown product which corresponds to the equilibrated working electrode potential for the bath with the unknown quantity of additive breakdown product.

Figure 3:
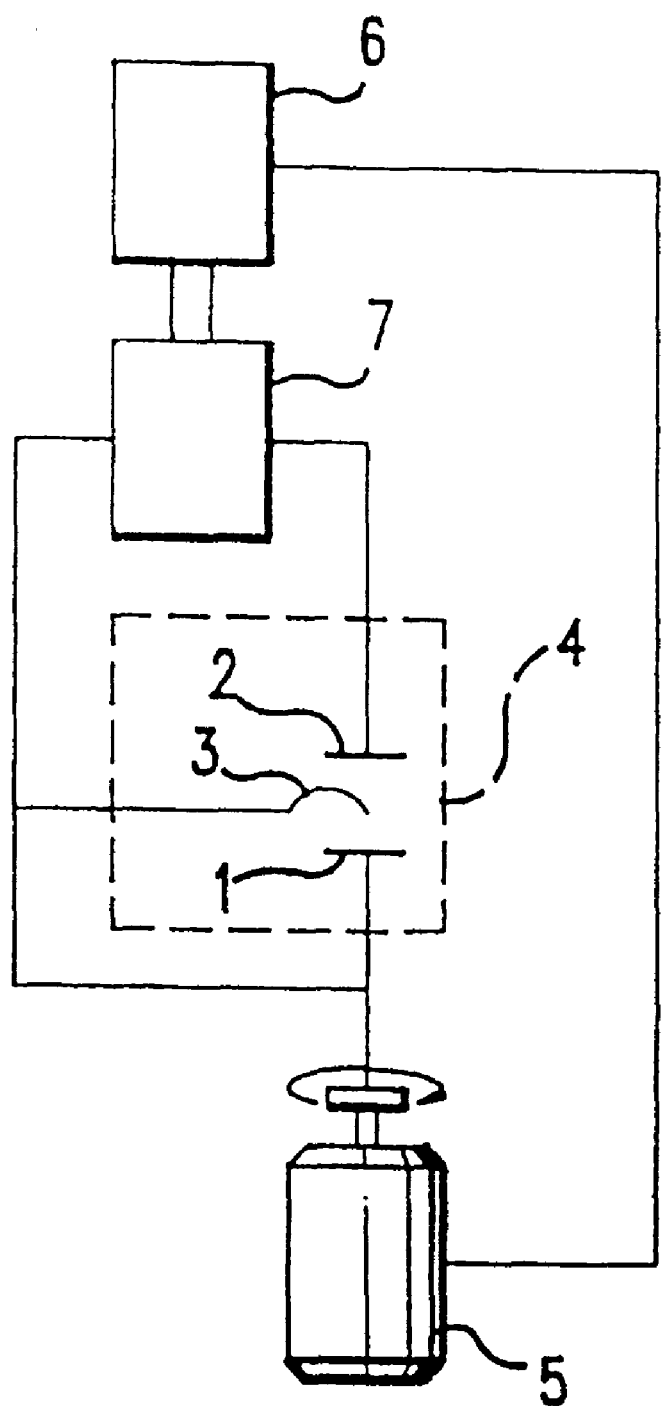
FIG. 3 is a schematic wiring diagram showing a device for practicing the method of the present invention.

FIG. 3 shows the schematic wiring diagram for a device useful in practicing the present invention. Three electrodes, a working electrode 1, a counter electrode 2, and a reference electrode 3, are immersed in a bath cell 4. The counter electrode is select and designed so as not to be easily polarized in the particular bath being evaluated. This is accomplished in part, by placing the counter electrode close to the working electrode. The working electrode is a suitable metal disk such as platinum, copper, nickel, chromium, zinc, tin, gold, silver, lead, cadmium, solder, glassy carbon, mercury and stainless steel, and is preferably platinum. The working electrode is preferably a rotating disc electrode ("RDE"), and more preferably a platinum RDE. The working electrode typically has a flat, polished surface, small diameter and may be mounted flush with the end of a Kel-F cylinder. A small diameter disk is preferred since a larger diameter will result in poor sensitivity due to non-uniform current density across t e diameter. Other suitable working electrodes include any that provide a uniform current density and controlled agitation. The reference electrode is conventionally, a saturated Calomel reference electrode ("SCE") or silver/silver chloride electrode. The counter electrode is preferably platinum. To establish relative motion between the working electrode and the bath, a motor 5 is used to rotate the working electrode to which contact is made by slip brushes.

A computer 6 is used to control an electronic potentiostat 7 which controls the energy input between the working electrode relative to the reference electrode. For laboratory testing of the method, instrumentation such as a Pine Instruments potentiostat under computer control may be used. Using a suitable program, the energy input sequences of the present invention may be applied to the working electrode. The output of the device can also be plot ed or graphically displayed to show the changes in energy output versus time for each step. The terms "energy input" and "energy output" in the following description of the methods an claims will refer to control of the potential (energy input) while monitoring current density (energy output), or control of current density (energy input) while monitoring potential (energy output).

The following description of the method will be described by reference to energy input as current and energy output as potential, and will be described by reference to standard acid/copper electroplating baths. The working electrode is normally selected or initial y plated to match the metal in the plating bath in order to maximize adsorption of the respective brighteners used in the baths. It is preferred that the working electrode is pre-plated with copper.

In general, according to the present method, a working electrode, such as a platinum rotating disc electrode, is pre-plated with a copper film from an organic additive-free electroplating bath is immersed at open circuit potential in a bath sample and the potential ("E") drift is monitored for a period of time, such as from about 5 seconds to about 20 minutes. A section of the resulting curve with the highest potential rate of change is used to calculate the slope of the curve.

Typically, the method of the present invention begins with a cleaning step to clean the working electrode. An anodic cleaning process may be carried out galvaostatically at approximately 80 ASF for a time sufficient to clean the electrode or until the voltage reaches 1.6 volts. Alternatively, the cleaning may be carried out at 1.6 volts for approximately 10 seconds, or the electrode may be cleaned chemically by treating with nitric acid followed by rinsing with deionized water.

The second step is to plate a thin layer of copper, approximately 5–5000 Å, on the disk by placing the disk in an electroplating bath solution for 10–300 seconds at a plating current between 1–100 ASF. The solution is an organic additive-free copper electroplating solution. If the disk is made of a metal which readily adsorbs organic additives, or induces potential driven adsorption of the additives, used in electroplating baths, this step may not be needed. However, when the present invention is used to monitor additive breakdown products in a copper electroplating bath for the electroplating of wafers, it is preferred that the electrode be pre-plated with a copper film.

In the next step, the electrode is immersed, without rinsing, in a sample bath containing an additive breakdown product to be analyzed. In general, the speed of th RDE is reduced as compared to the speed used during the copper pre-plating step. The electrode is then allowed to equilibrate, typically from about 5 seconds to 20 minutes, and preferably from about 5 to about 10 seconds. After equilibration the potential drift is monitored at open circuit potential for a period of time until the change in potential of the working electrode with time is minimal, typically about 5 minutes. From the resulting curve of the observed potential drift, the slope is calculated from the section of the curve with the highest rate of change.

The above process is repeated with bath samples containing various levels of known additive breakdown products. A calibration curve is then prepared. Bath samples containing an unknown amount of additive breakdown product is then analyzed according to the above procedure and the value of potential obtained is compared to the calibration curve and the quantity of additive breakdown product determined from the curve.

According to the present invention the presence of additive breakdown products in an electroplating bath may be controlled by the steps of: a) determining the quantity of additive breakdown product as described above; and b) comparing the quantity of additive breakdown product to a preset value; provided that when the quantity of additive breakdown product exceeds the preset value, a control process is activated that reduces the quantity of additive breakdown product. A variety of processes may be employed to control the level of additive breakdown product, such as, but not limited to, passing at least a portion if the bath through a carbon bed, adding fresh electrolyte or activating a secondary rectifier/Pt electrode to electrolyze the additive breakdown products.

The present invention is suitable for determining the quantity of breakdown products of any electroplating bath additives, preferably organic additives. The present invention is particularly suitable for strongly adsorbed additive breakdown products. Particularly suitable additive breakdown products that can be quantitated according to the present invention are those having the formula RSH, wherein R is an $(C_1-C_6)$alkyl or aryl. The present t method is suitable for quantitating a wide amount of additive breakdown products. Typically, the amount of additive breakdown product that can be quantitated according to the present invention is about 1000 ppb or less, preferably about 500 ppb or less, more preferably about 50 ppb or less, still more preferably about 100 ppb or less, and even more preferably about 5 ppb or less.

Suitable additives include, but are not limited to, leveling agents, brighteners, accelerators, suppressors, and the like. It is preferred that the additive to be evaluated is an accelerator. It is further preferred that the accelerator is an organic disulfide of the formula $R^1-S-R^1$, wherein $R^1$ is a $(C_1-C_6)$alkyl or aryl and is optionally substituted with one or more substituent groups. Suitable substituent groups include, but are not limited to, hydroxy, $(C_1-C_6)$alkoxy, thiol, sulfonic acids and the like. It is preferred that the aryl group is phenyl or naphthyl. Preferred accelerators include those of the formula $HO_3S-R^1-S\ S-R^1-SO_3H$ and $HO_3S-Ar-S-S-Ar-SO_3H$. The amount of additive present in the electroplating bath is within the ability of one skilled in the art.

The present method may be used with any electroplating bath formulation, such as copper, nickel, chromium, zinc, tin, gold, silver, lead and cadmium plating baths. Plating baths containing mixtures of metals to be plated are also contemplated by the present invention. It is preferred that the plating bath is a copper or copper-alloy electroplating bath, and more preferably a copper electroplating bath. Typical copper electroplating bat formulations are well known to those skilled in the art and include, but are not limited to, an electrolyte and electrolyte and one or more sources of copper ions. Suitable electrolytes include, but re not limited to, sulfuric acid, acetic acid, fluoroboric acid, methane sulfonic acid, ethane sulfonic acid, trifluoromethane sulfonic acid, phenyl sulfonic acid, methyl sulfonic acid, p-toluenesulfonic acid, hydrochloric acid, phosphoric acid and the like. The acids are typically present in an amount in the range of from about 1 to about 300 g/L. The acids may further include a source of halide ions, such as chloride ions. Suitable sources of copper ions include, but are not limited to, copper sulfate, copper chloride, copper acetate, copper nitrate, copper fluoroborate, copper methane sulfonate, copper phenyl sulfonate and copper p-toluene sulfonate. Such copper ion sources are typically present in an amount in the range of from about 10 to about 300 g/L of plating solution.

Figure 4:
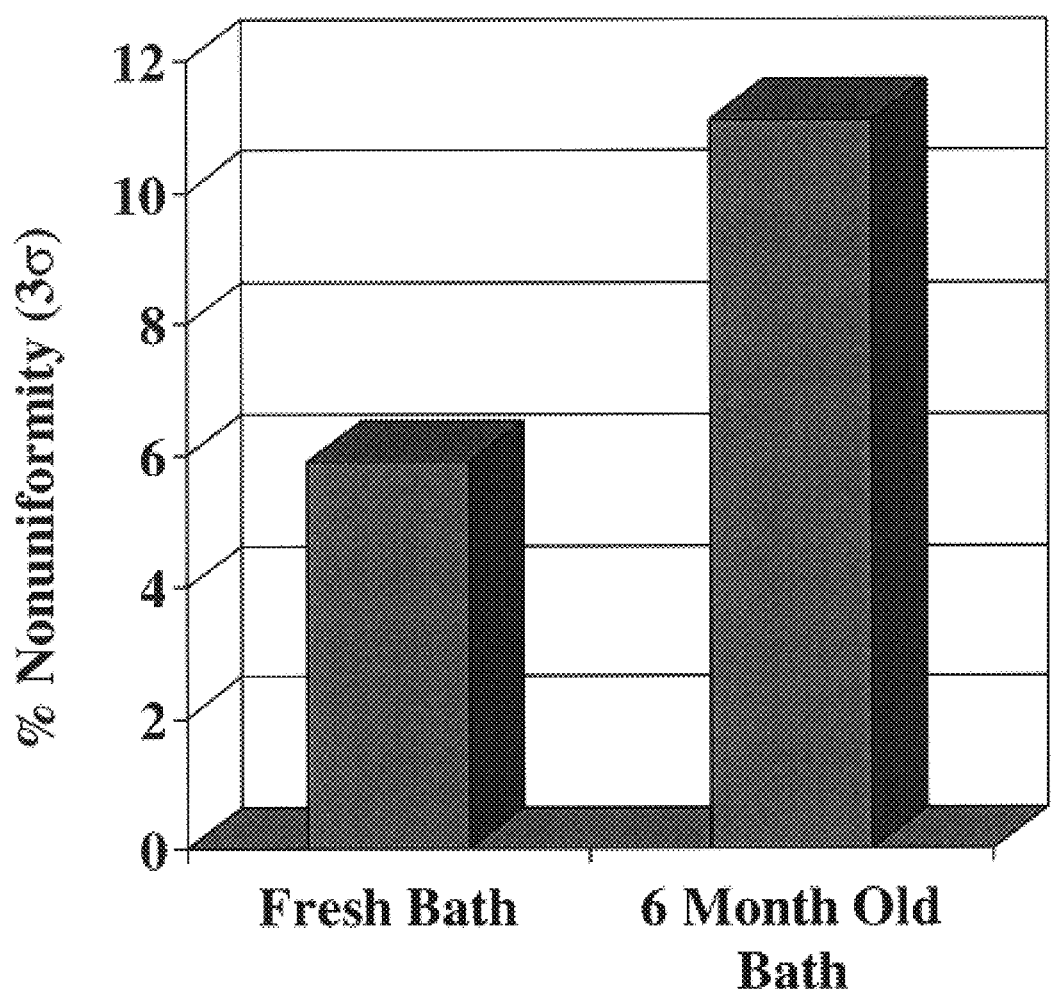
FIG. 4 shows a graphical comparison of the age of an electroplating bath with the percent nonuniformity of plated wafers.
Figure 5:
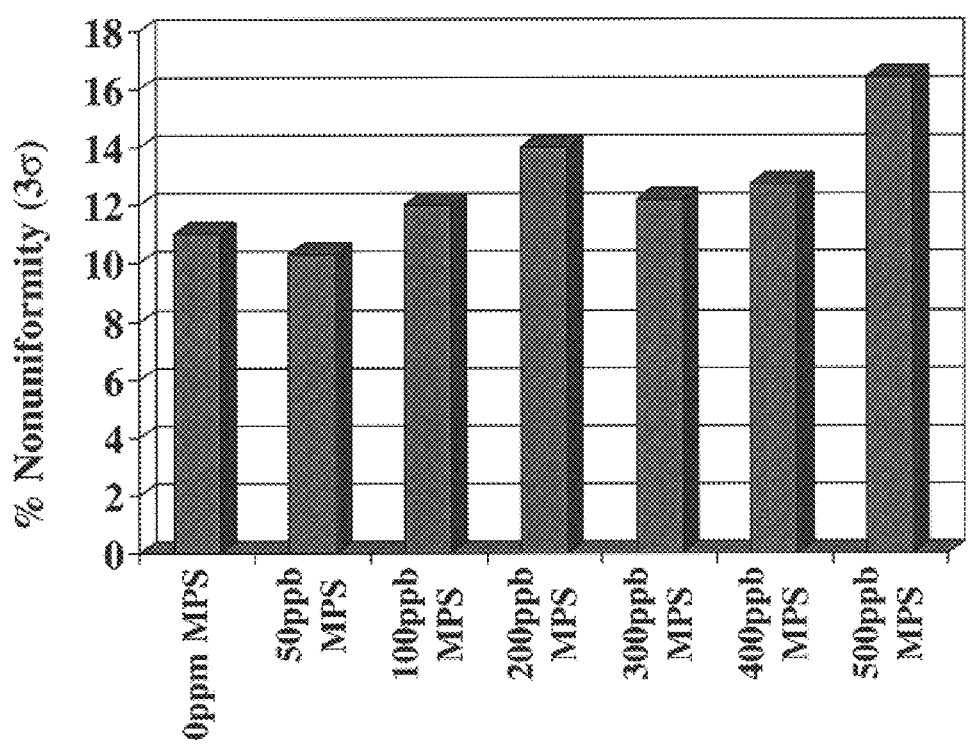
FIG. 5 shows a graphical representation of the percent nonuniformity of plated wafers versus additive breakdown product concentration.

It has also been surprisingly found that the presence of additive breakdown product adversely affects within wafer uniformity during the electroplating of wafers in electronic device manufacture. Additive breakdown product accumulates in the electroplating bath over time. FIG. 4 shows a graphical comparison of the age of an electroplating bath with the percent nonuniformity of plated wafers. As can be seen from FIG. 4, as the electroplating bath ages, the percent non-uniformity within (or across) a wafer increases. Such non-uniformity results from a high level of additive breakdown product which adversely affects the fill performance of the bath. FIG. 5 shows that as the concentration of additive breakdown product in the electroplating bath increase, so does the percentage of within wafer nonuniformity.

Thus, the present invention also provides method of maintaining within wafer uniformity during the electroplating of wafers including the step of controlling the level of additive breakdown product in the electroplating bath. Typically, the additive breakdown product is controlled at level that does not substantially increase within wafer nonuniformity, and preferably at a level that does not increase within wafer nonuniformity, as compared to wafers plated from baths that are free of such additive breakdown product. For example, when the additive breakdown product has the formula RSH, wherein R is an ($C^1$–$C_6$)alkyl or aryl, it is typically maintained in the plating bath at a level of about 300 ppb or less, preferably at about 100 ppb or less, and more preferably at about 50 ppb or less.

In maintaining such within wafer uniformity, the level of additive breakdown product is determined according to the methods described above. The level of additive breakdown product may be controlled by a wide variety of means, such as, but not limited to, passing at least a portion of the bath through a carbon bed, adding fresh electrolyte or activating a secondary rectifier/Pt electrode to electrolyze the additive breakdown products.

The following examples are intended to illustrate further various aspects of the present invention, but are not intended to limit the scope of the invention in any aspect.

EXAMPLE 1

A platinum rotating disc electrode is pre-plated with a copper film from an organic additive-free copper electroplating bath at 40 mA/cm$^2$ and 2500 rpm for 2 minutes. Within 20 seconds after plating and without rinsing the electrode, the RDE rotation speed is reduced to 500 rpm and the electrode is immersed in the sample bath. Once stabilized, about 5–10 seconds, the potential drift is monitored at open circuit potential for 5 minutes. The highest positive rate, in mV/s, of change typically occurs within the first 100 seconds. From the resulting curve of the observed potential drift, calculate the slope from the section of the curve with the highest rate of change. Prepare a calibration curve using the same procedure and a solution with a matrix similar to the bath to be analyzed. Inject the solution containing known amounts of additive breakdown products. Derive a line equation from the trend line of the scattered plot of the slopes versus concentrations and use the equation to calculate additive breakdown products in bath samples.

EXAMPLE 2

Wafers were plated with copper from an electroplating bath containing an alkyl disulfide accelerator as the additive. Wafers plated from a fresh bath were compared with wafers plated from the same bath after 6 months. Within wafer uniformity was measured using a Resmap tool. The wafers plated from the six-month old bath had a significantly increased percentage of within wafer nonuniformity. These data are shown in FIG. 4.

EXAMPLE 3

Wafers were plated with copper from an electroplating bath containing various levels of alkyl thiol, MPS, the alkyl disulfide accelerator breakdown product. The plated wafers were examined for within wafer uniformity as described in Example 2. Increasing the concentration of breakdown product had an adverse affect on within wafer uniformity, that is, the percentage of within wafer nonuniformity increased with increasing breakdown product concentration. These data are shown in FIG. 5.

What is claimed is:

1. A method of maintaining within-wafer uniformity during the electroplating of wafers comprising controlling a level of organic additive breakdown product in an electroplating bath wherein the additive breakdown product is controlled by the method comprising the steps of: a) obtaining a plurality of plating baths where each bath has a known quantity of the additive breakdown products, but where the quantity of additive breakdown product in each bath differs from the quantity in the other baths; b) for each bath, providing a counter electrode, a cleaned working electrode and a reference electrode immersed in the bath, and equilibrating the working electrode without energy input to adsorb additive breakdown product for a period of time until the change in potential of the working electrode with time is minimal and measuring the value of the potential; c) for each bath, correlating the quantity of additive breakdown product with the value of potential obtained in step b); d) obtaining a plating bath having an unknown quantity of additive breakdown product, placing the electrodes in the bath and performing step b); e) choosing from the correlations in step c a quantity of additive breakdown product which corresponds to the equilibrated working electrode potential for the bath with the unknown quantity of additive breakdown product; and f) comparing the quantity of additive breakdown product to a preset value; provided that when the quantity of additive breakdown product exceeds the preset value, a control process is activated that reduces the quantity of additive breakdown product.

2. The method of claim 1 wherein the additive breakdown product has the formula RSH, wherein R is an $(C_1-C_6)$alkyl or aryl.

3. The method of claim 2 wherein the level of additive breakdown product is 300 ppb or less.

4. The method of claim 3 wherein the level of additive breakdown product is 100 ppb or less.

5. The method of claim 4 wherein the level of additive breakdown product is 50 ppb or less.

6. The method of claim 1 wherein the additive breakdown product is maintained at a level that does not substantially increase within wafer nonuniformity.

7. The method of claim 1 wherein the control process is selected from passing at least a portion of the bath through a carbon bed, adding fresh electrolyte or activating a secondary rectifier/Pt electrode to electrolyze breakdown products.

8. The method of claim 1 wherein the electroplating bath comprises a metal selected from the group consisting of copper, nickel, chromium, zinc, tin, gold, silver, lead, cadmium and mixtures thereof.

9. The method of claim 1 wherein the organic additive is selected from the group consisting of leveling agents, brighteners and suppressors.

10. The method of claim 1 wherein the organic additive has the formula $R^1$-S-S-$R^1$, wherein R' is $(C_1-C_6)$alkyl or aryl and is optionally substituted with one or more substituent groups selected from the group consisting of hydroxy, $(C_1-C_6)$alkoxy, thiol, and sulfonic acid.

11. A method of controlling a quantity of organic additive breakdown products in an electroplating bath comprising the steps of: a) obtaining a plurality of plating baths where each bath has a known quantity of the additive breakdown products, but where the quantity of additive breakdown product in each bath differs from the quantity in the other baths; b) for each bath, providing a counter electrode, a cleaned working electrode and a reference- electrode immersed in the bath, and equilibrating the working electrode without energy input to adsorb additive breakdown product for a period of time until the change in potential of the working electrode with time is minimal and measuring the value of the potential; c) for each bath, correlating the quantity of additive breakdown product with the value of potential obtained in step b); d) obtaining a plating bath having an unknown quantity of additive breakdown product, placing the electrodes in the bath and performing step b); e) choosing from the correlations in step c a quantity of additive breakdown product which corresponds to the equilibrated working electrode potential for the bath with the unknown quantity of additive breakdown product; and f) comparing the quantity of additive breakdown product to a preset value; provided that when the quantity of additive breakdown product exceeds the preset value, a control process is activated that reduces the quantity of additive breakdown product.

* * * * *